United States Patent
Schnell et al.

(10) Patent No.: US 7,405,957 B2
(45) Date of Patent: Jul. 29, 2008

(54) EDGE PAD ARCHITECTURE FOR SEMICONDUCTOR MEMORY

(75) Inventors: Josef Schnell, Charlotte, VT (US); Michael Richter, Ottobrunn (DE); Michael A. Killian, Richmond, VT (US)

(73) Assignee: Infineon Technologies AG, Munich (DE)

( * ) Notice: Subject to any disclaimer, the term of this patent is extended or adjusted under 35 U.S.C. 154(b) by 75 days.

(21) Appl. No.: 11/320,266

(22) Filed: Dec. 28, 2005

(65) Prior Publication Data

US 2007/0165439 A1 Jul. 19, 2007

(51) Int. Cl. *G11C 5/06* (2006.01)
(52) U.S. Cl. .................................. 365/63; 365/230.03
(58) Field of Classification Search ............ 365/189.03, 365/63, 230.03
See application file for complete search history.

(56) References Cited

U.S. PATENT DOCUMENTS

| | | | |
|---|---|---|---|
| 5,712,827 A | 1/1998 | Ogihara et al. | |
| 6,515,505 B1 | 2/2003 | Rees | |
| 6,806,582 B2 | 10/2004 | Ahn et al. | |
| 6,873,563 B2 | 3/2005 | Suwa et al. | |
| 6,886,070 B2 | 4/2005 | Stafford | |
| 2001/0049766 A1* | 12/2001 | Stafford | 711/103 |
| 2003/0076702 A1 | 4/2003 | Kyung et al. | |
| 2004/0233721 A1 | 11/2004 | Kim et al. | |
| 2005/0130464 A1* | 6/2005 | Grabbe | 439/83 |

OTHER PUBLICATIONS

PCT International Search Report for International Application No. PCT/EP2006/012572 mailed on Jun. 12, 2007 (4 pages).

\* cited by examiner

*Primary Examiner*—Huan Hoang
*Assistant Examiner*—Jason Lappas
(74) *Attorney, Agent, or Firm*—Dicke, Billig & Czaja, PLLC

(57) ABSTRACT

A memory includes a wafer having at least a first and second edge, at least one memory bank array, a data path, and a plurality of data pads. The data path is coupled to the memory bank array. The plurality of data pads are coupled to the data path and configured with the data path to bus data to and from the memory bank array. The data pads are further configured such that each of the data pads are located adjacent the first and second edges of the wafer. The memory component is configurable for alternative applications such that in a first application all of the data pads used to bus data are located only on the first edge of the wafer and such that in a second application at least one of the data pads used to bus data is located on the first edge of the wafer and at least one of the data pads used to bus data is located on the second edge of the wafer.

5 Claims, 6 Drawing Sheets

EDGE PAD ARCHITECTURE FOR SEMICONDUCTOR MEMORY

BACKGROUND

Semiconductor circuits are formed on semiconductor chips assembled into packages. Generally, the packages of the semiconductor chip device help protect the semiconductor chip against external contamination sources and external stresses and electromagnetism. In some cases, the semiconductor circuit is formed on a die by a first manufacture and then delivered to its customer as a "known good die" or "KGD." The customer then integrates this KGD into its own product before finally packaging the semiconductor circuit as a semiconductor chip or finished application package. In yet other applications, the manufacture of the semiconductor circuit completely forms the semiconductor chip as a component, such as a ball grid array (BGA) or similar type of package.

Depending on the particular type of application, the pad locations for the semiconductor package are different. Providing a different pad arrangement for each different type of chip application typically requires providing a custom pad arrangement that is dependent upon the particular application. For these and other reasons, there exists a need for the present invention.

SUMMARY

One embodiment of the present invention provides a memory. The memory includes a wafer having at least a first and second edge, at least one memory bank array, a data path, and a plurality of data pads. The data path is coupled to the memory bank array. The plurality of data pads are coupled to the data path and configured with the data path to bus data to and from the memory bank array. The data pads are further configured such that each of the data pads are located adjacent the first and second edges of the wafer. The memory component is configurable for alternative applications such that in a first application all of the data pads used to bus data are located only on the first edge of the wafer and such that in a second application at least one of the data pads used to bus data is located on the first edge of the wafer and at least one of the data pads used to bus data is located on the second edge of the wafer.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
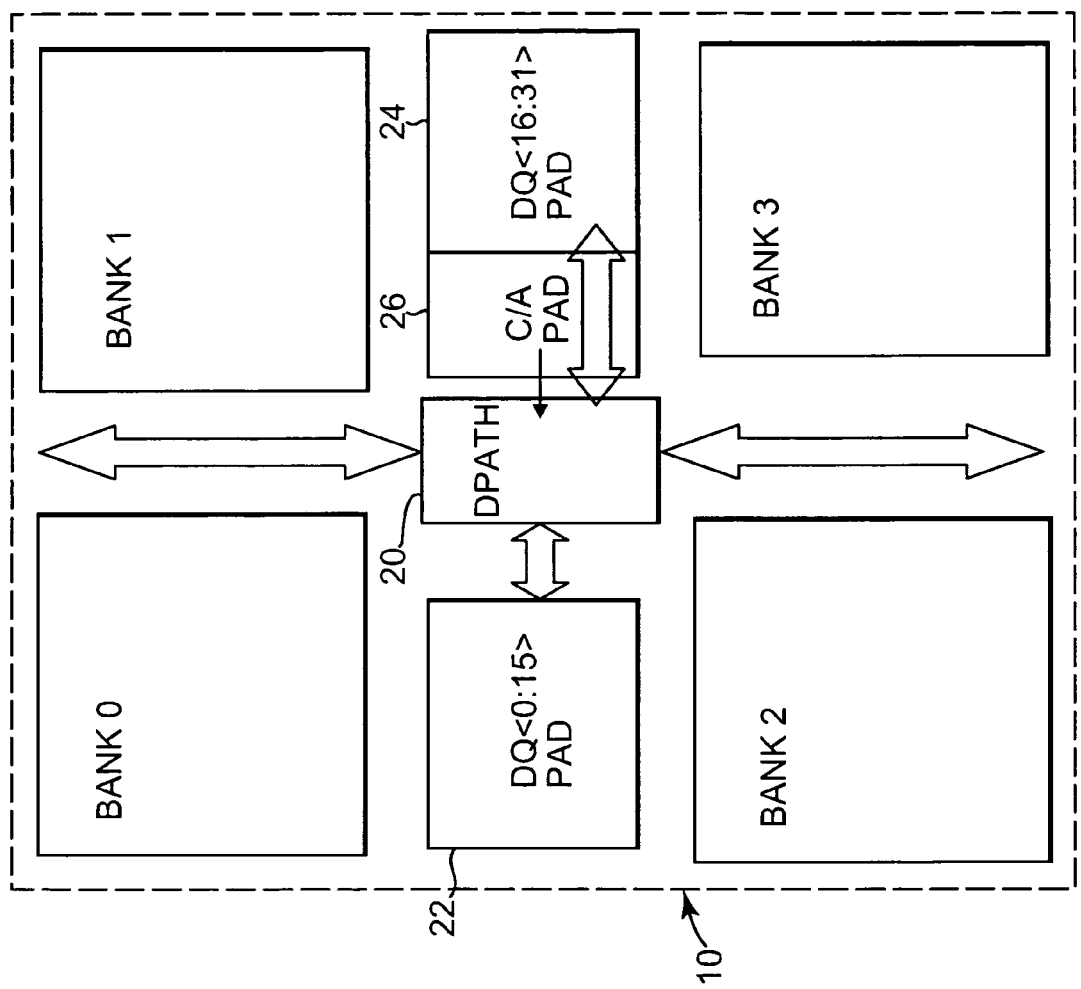
FIG. 1 illustrates a memory device with a conventional center pad arrangement.

FIG. 1 illustrates a memory device with a conventional center pad arrangement. Memory device 10 includes four memory bank arrays: bank 0, bank 1, bank 2, and bank 3. Access to the four memory banks is provided by data path 20 via which data is read from and written to bank 0, bank 1, bank 2, and/or bank 3. Memory device 10 further includes data pads 22 and 24, each coupled to data path 20. Finally, memory device 10 includes command and address pad 26 coupled to data path 20.

In operation, command and address pad 26 receives command and address signals for retrieving and/or writing data to and from memory banks in memory device 10. Data is then retrieved from or written to the various memory banks via data pads 22 and 24. In one embodiment, data pad 22 accommodates the first 16-bits of data (DQ<0:15>), and data pad 24 accommodates the next 16-bits of data (DQ<16:31>) for a system having 32-bit architecture.

In one example, memory device 10 is a semiconductor memory chip such as a DRAM or SDRAM device. Bank 0, bank 1, bank 2, and bank 3 are organized in a square or rectangular shape configuration on the semiconductor memory chip. Data pads 22 and 24, as well as command and address pad 26 are then physically situated between the memory banks on the chip. In this way, all of the pads for memory device 10 are located internally on the memory chip and no pads are located on the chip exterior. In such a configuration, the pads are bonded to and then the chip package is finally assembled.

In some applications, however, such as low power DRAM applications, data pads and command and address pads need to be located adjacent the edge of the semiconductor chip. As such, the configuration illustrated in FIG. 1 is not applicable to some applications, such as some low power DRAM applications.

Figure 2:
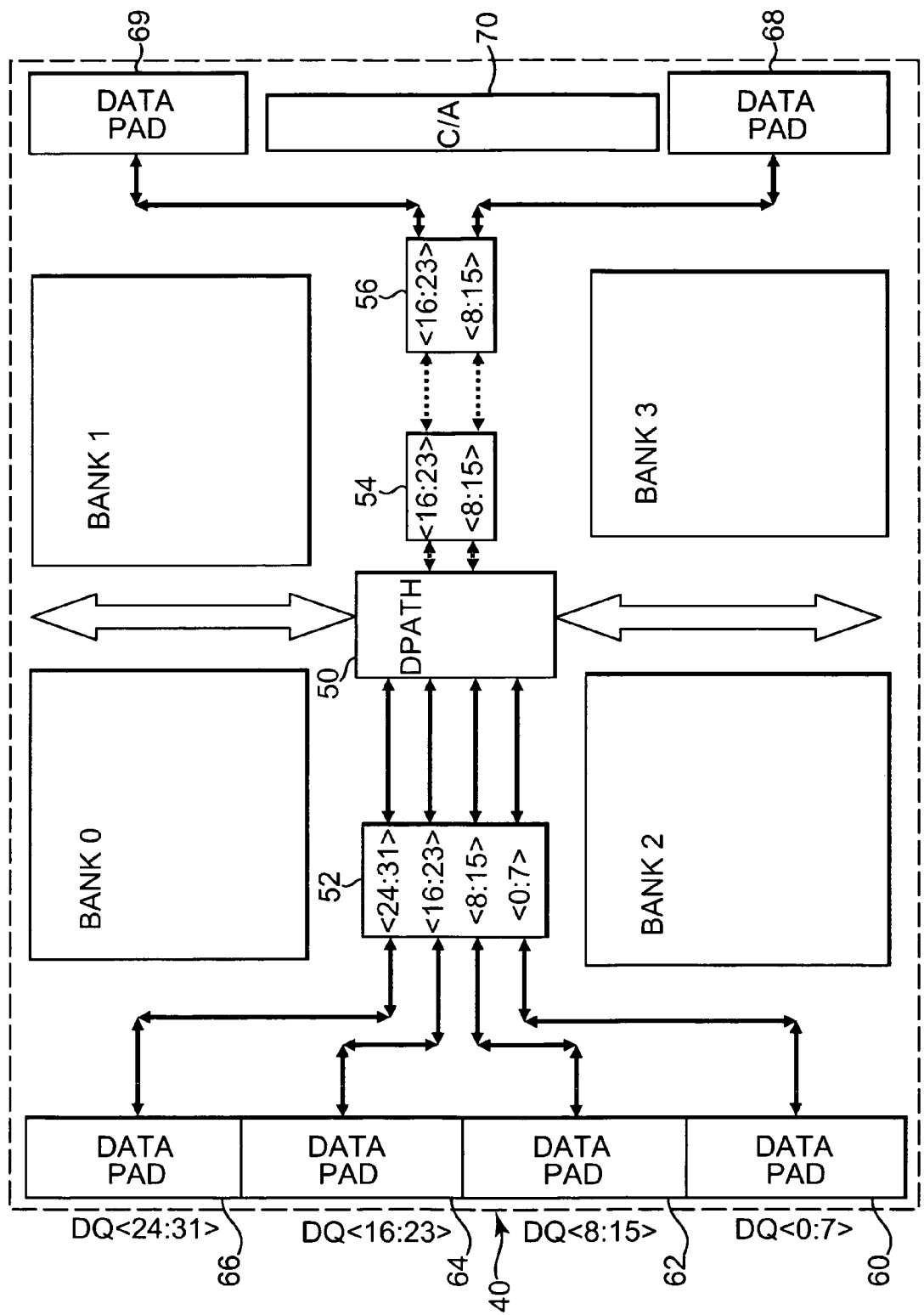
FIG. 2 illustrates a memory device with edge pad architecture in accordance with one embodiment of the present invention.

FIG. 2 illustrates semiconductor memory device 40 in accordance with one embodiment of the present invention. In one embodiment, memory device 40 includes a plurality of memory banks: bank 0, bank 1, bank 2, and bank 3. Data path 50 in memory device 40 is coupled to the plurality of memory banks (bank 0, bank 1, bank 2, and bank 3) such that data may be read from and written to the plurality of memory banks via data path 50. A plurality of data pads 60, 62, 64, 66, 68 and 69 are provided adjacent the edges of semiconductor memory device 40. In addition, command and address pad 70 is provided adjacent some of the data pads on an edge of semiconductor memory device 40.

Data pads and command and address pads are coupled to the plurality of memory banks in semiconductor memory device 40 via buffer and multiplexing logic and data path 50. In one embodiment, first buffer and multiplexing logic block 52 is provided between data path 50 and data pads 60, 62, 64, and 66. In one embodiment, second and third buffer and multiplexing logic blocks 54 and 56 are provided between data path 50 and data pads 68 and 69 and command and address pad 70.

In one embodiment, data pads 60, 62, 64, and 66 are located adjacent a first edge of semiconductor memory device 40. Data may be written to and read from memory device 40 via data pads 60, 62, 64, and 66 adjacent this first edge of semiconductor memory device 40. Data is bussed from data pads 60, 62, 64, and 66 to first logic block 52, then to data path 50, then to one or more of the plurality of memory banks (bank 0, bank 1, bank 2, or bank 3). Similarly, data pads 68 and 69 are located adjacent a second edge of semiconductor memory device 40. In one embodiment, command and address pad 70 is also located adjacent this second edge of memory device 40. Data is bussed from the pads on this second edge of memory device 40 via second and third logic blocks 54 and 56, then to data path 50, and then to one or more of the plurality of memory banks (bank 0, bank 1, bank 2, or bank 3).

Semiconductor memory device 40 provides an edge pad architecture that accommodates various different application architectures. When memory device 40 is configured in a semiconductor chip, some application architecture requires that all data pads are on one edge of the chip. Other application architecture may require that some pads are on a first edge and some are on a second edge. Semiconductor memory device 40 provides flexible edge pad architecture that can accommodate these various design applications by appropriately configuring memory device 40 for the particular application.

In one embodiment, data path 50, first, second and third buffer and multiplexing logic blocks 52, 54, and 56 are all controlled such that data is bussed only to and from data pads on a first edge of semiconductor memory device 40, while in another application, data path 50, first, second and third buffer and multiplexing logic blocks 52, 54, and 56 are all controlled such that data is bussed from data pads on both the first and second first edges of semiconductor memory device 40. In yet other embodiments some of the data pads are used and in others all of the data pads are used. Thus, device 40 provides flexibility for tailoring memory device 40 for particular applications.

In one embodiment, semiconductor memory device 40 is a semiconductor memory chip, such that data pads 60, 62, 64, 66, 68 and 69 are located along a first and a second edge of the chip package. In another embodiment, semiconductor memory device 40 is a semiconductor wafer or die. In that case, data pads 60, 62, 64, 66, 68 and 69 are located along a first and a second edge of the semiconductor wafer or die.

Figure 3:
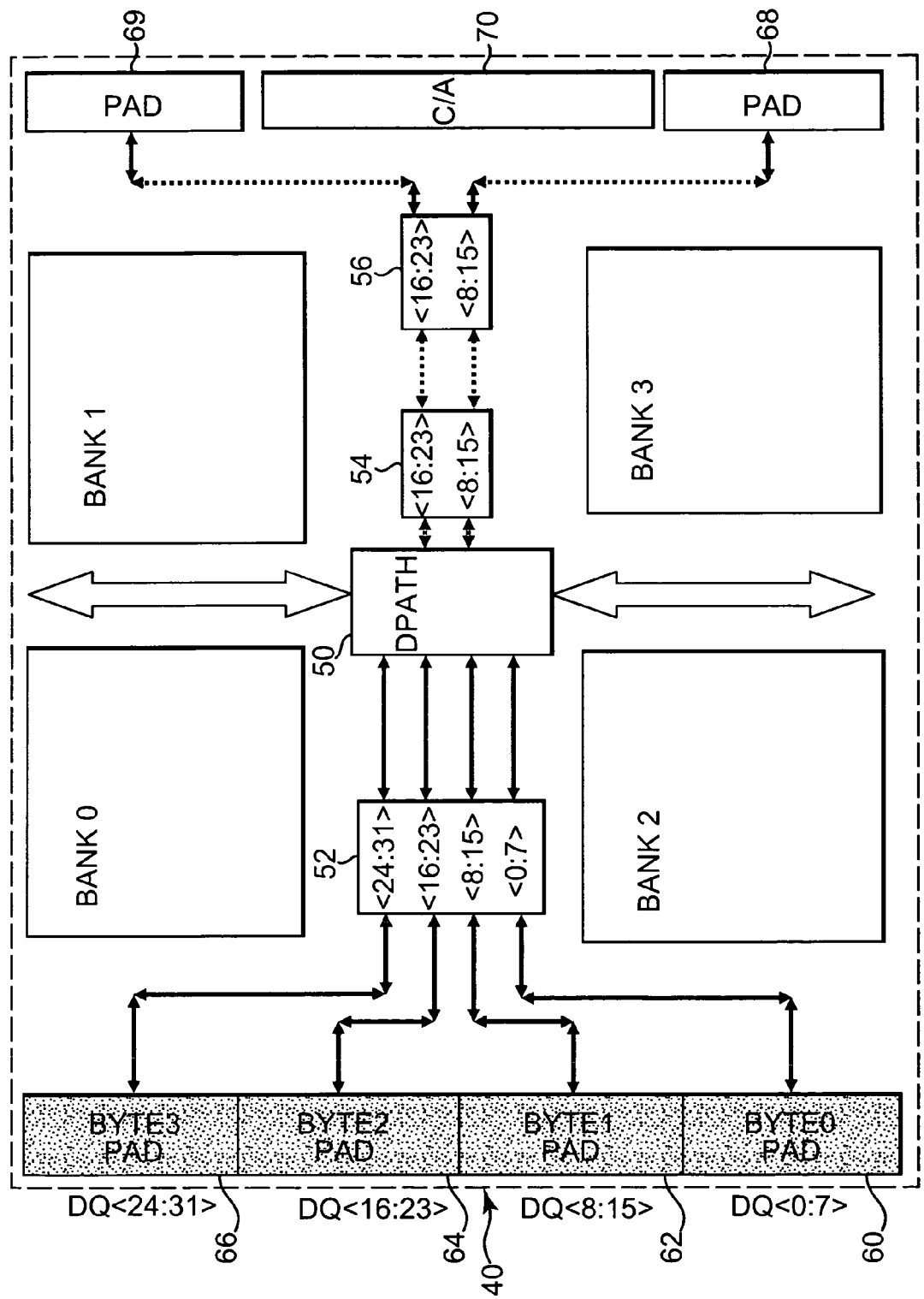
FIG. 3 illustrates a memory device with edge pad architecture configured as a known good die in accordance with one embodiment of the present invention.

FIG. 3 illustrates semiconductor memory device 40 configured as a known good die (KGD) component using 32-bit processing. Memory device 40 is configured as described above, including bank 0, bank 1, bank 2, and bank 3, data path 50, first, second and third buffer and multiplexing logic blocks 52, 54, and 56, data pads 60, 62, 64, 66, 68, and 69, and command and address pad 70. As with the prior illustration of semiconductor memory device 40, all data pads 60, 62, 64, 66, 68, and 69 and the command and address pad 70 are located adjacent a first or a second edge of semiconductor memory device 40.

In one embodiment, memory device 40 is configured such that all the data pads that will be used in the application are located on a single edge of memory device 40. As such, in one embodiment, only data pads 60, 62, 64, and 66 are used, and all these data pads are located adjacent a first edge of memory device 40. As such, data pads 68 and 69, located adjacent a second edge of memory device 40, are not used.

In one embodiment, memory device 40 illustrated in FIG. 3 is used in a 32-bit application with four data bytes, including byte 0, byte 1, byte 2, and byte 3. In one such embodiment, memory device 40 is configured such that byte 0 is transmitted via pad 60, byte 1 is transmitted via pad 62, byte 2 is transmitted via pad 64, and byte 3 is transmitted via pad 66. Furthermore, pin locations for the various DQ bites are located adjacent pads 60, 62, 64, and 66. In this way, pad 60 transmits the first 8 bits of data (pin group DQ<0:7>), pad 62 transmits the next 8 bits of data (pin group DQ<8:15>), pad 64 transmits the next 8 bits of data (pin group DQ<16:23>), and pad 66 transmits the last 8 bits of data (pin group DQ<24:31>). The data path from these data pads 60, 62, 64, and 66 to first logic block 52 are indicated with two-way arrows in FIG. 3, indicating the data is bussed in both directions. Similarly, arrows indicate the path from logic block 52 to data path 50, and then on to the plurality of memory banks.

In some applications, such as low-power DDR DRAM, the architecture requires that all the data pads are at a single edge of the memory chip package. Consequently, semiconductor memory device 40 in accordance with one embodiment of the present invention can accommodate such architecture requirements. In this way, memory device 40 can be used in a multi-chip package where a multitude of memory devices are stacked on top of each other. Access to each of the chips is still possible with data pads on a single edge of the memory chip.

Figure 4:
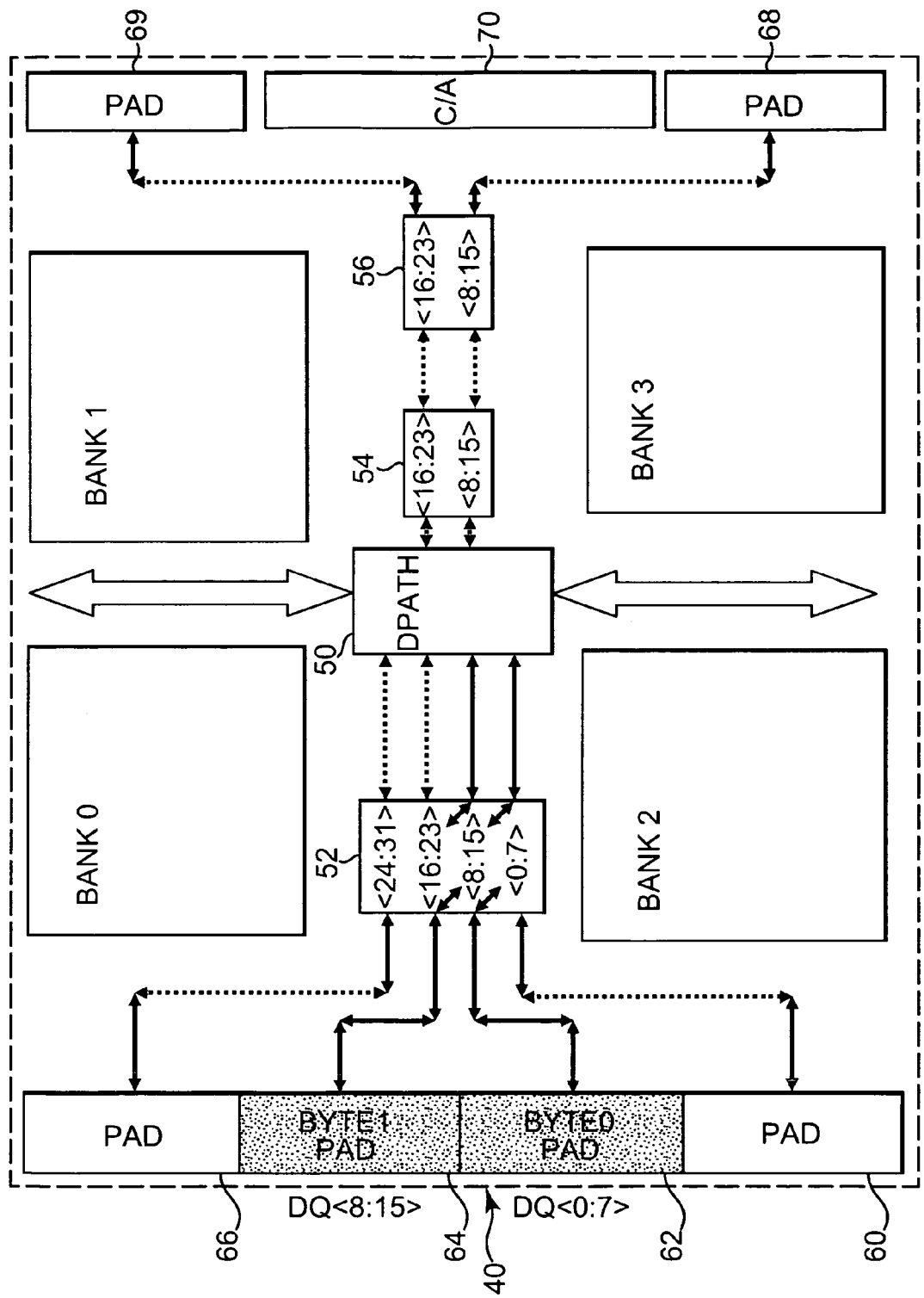
FIG. 4 illustrates a memory device with edge pad architecture configured as a known good die in accordance with an alternative embodiment of the present invention.

FIG. 4 illustrates semiconductor memory device 40 configured as a known good die (KGD) component using 16-bit processing. Semiconductor memory device 40 is configured as described above, including bank 0, bank 1, bank 2, and bank 3, data path 50, first, second and third buffer and multiplexing logic blocks 52, 54, and 56, data pads 60, 62, 64, 66, 68, and 69, and command and address pad 70. As with the prior illustrations of semiconductor memory device 40, all data pads 60, 62, 64, 66, 68, and 69 and the command and address pad 70 are located adjacent a first or a second edge of semiconductor memory device 40.

In one embodiment, semiconductor memory device 40 is configured such that all the data pads that will be used in the application are located on a single edge of memory device 40. In this embodiment using 16-bit processing only two data pads 62 and 64 are utilized. Each of data pads 62 and 64 are adjacent a first edge of semiconductor memory device 40. In one embodiment, byte 0 is transmitted via pad 62 and byte 1 is transmitted via pad 64. As such, the first 8 bits of data (DQ<0:7>) are transmitted via data pad 62 and the next 8 bits (DQ<8:15>) are transmitted via data pad 64.

In one embodiment, in order to drive data from data pads 62 and 64, data is adjusted in the data path within first logic block 52. In one example, data from data path 50 is adjusted in first logic block 52 from the <0:7> pins to the <8:15> pins and from the <8:15> pins to the <16:23> pins, as illustrated with arrows within logic block 52 in FIG. 4. In this way, the center two data pads along a first edge of semiconductor memory device 40 are used in one 16-bit KGD configuration.

Figure 5:
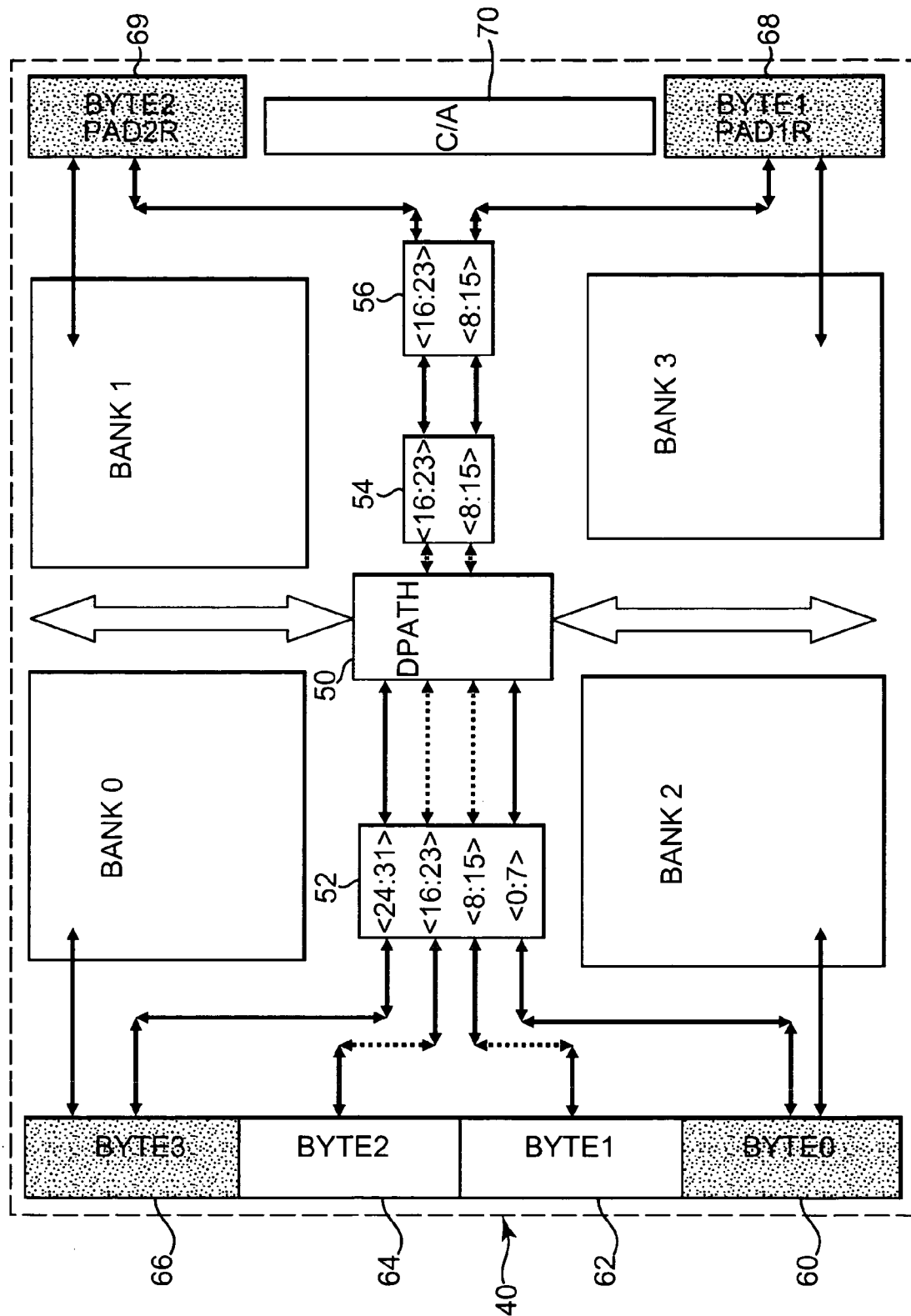
FIG. 5 illustrates a memory device with edge pad architecture configured as a ball grid array in accordance with one embodiment of the present invention.

FIG. 5 illustrates semiconductor memory device 40 configured as a ball grid array (BGA) component using 32-bit processing. Semiconductor memory device 40 is configured as described above, including bank 0, bank 1, bank 2, and bank 3, data path 50, first, second, and third buffer and multiplexing logic blocks 52, 54, and 56, data pads 60, 62, 64, 66, 68, and 69 and command and address pad 70. As with the prior illustrations of semiconductor memory device 40, all data pads 60, 62, 64, 66, 68, and 69 and the command and address pad 70 are located adjacent a first or a second edge of semiconductor memory device 40.

In one embodiment, memory device 40 is configured for a BGA application such that all the data pads that will be used in the application are located on two edges of memory device 40. As such, in one embodiment data pads 60, 66, 68, and 69 are used; data pads 60 and 66 being on a first edge and data pads 68 and 69 being on a second edge of memory device 40. As such, data pads 62 and 64 are not used.

In one embodiment, byte 0 is transmitted via data pad 60, byte 1 is transmitted via data pad 68, byte 2 is transmitted via data pad 69, and byte 3 is transmitted via data pad 66. As such, two data bytes are transmitted at a first edge of semiconductor memory device 40 and two data bytes are transmitted at a second edge of semiconductor memory device 40. First and second edges are on opposite sides of the chip of semiconductor memory device 40. In one case, command and address pad 70 is located between two data pads on one edge of semiconductor memory device 40.

In one embodiment, pad 60 transmits the first 8 bits of data to pin group DQ<16:23>), pad 68 transmits the next 8 bits of data (pin group DQ<24:31>), pad 69 transmits the last 8 bits of data (pin group DQ<8:15>), and pad 66 transmits the next 8 bits of data to pin group DQ<0:7>). Such a configuration can be useful in certain applications. In other embodiments, different pad-to-pin configurations can be used as well.

In one embodiment, second and third buffer and multiplexing logic blocks 54 and 56 are used to bus data between data path 50 and data pads 68 and 69. Using more than one buffer can be an effective way to limit wire length of the read/write data lines. Limiting the wire length in this way can reduce power consumption and enhance performance in some configurations. Thus, in some embodiments, one buffer is used, and in other embodiments, a plurality of buffers is used.

Figure 6:
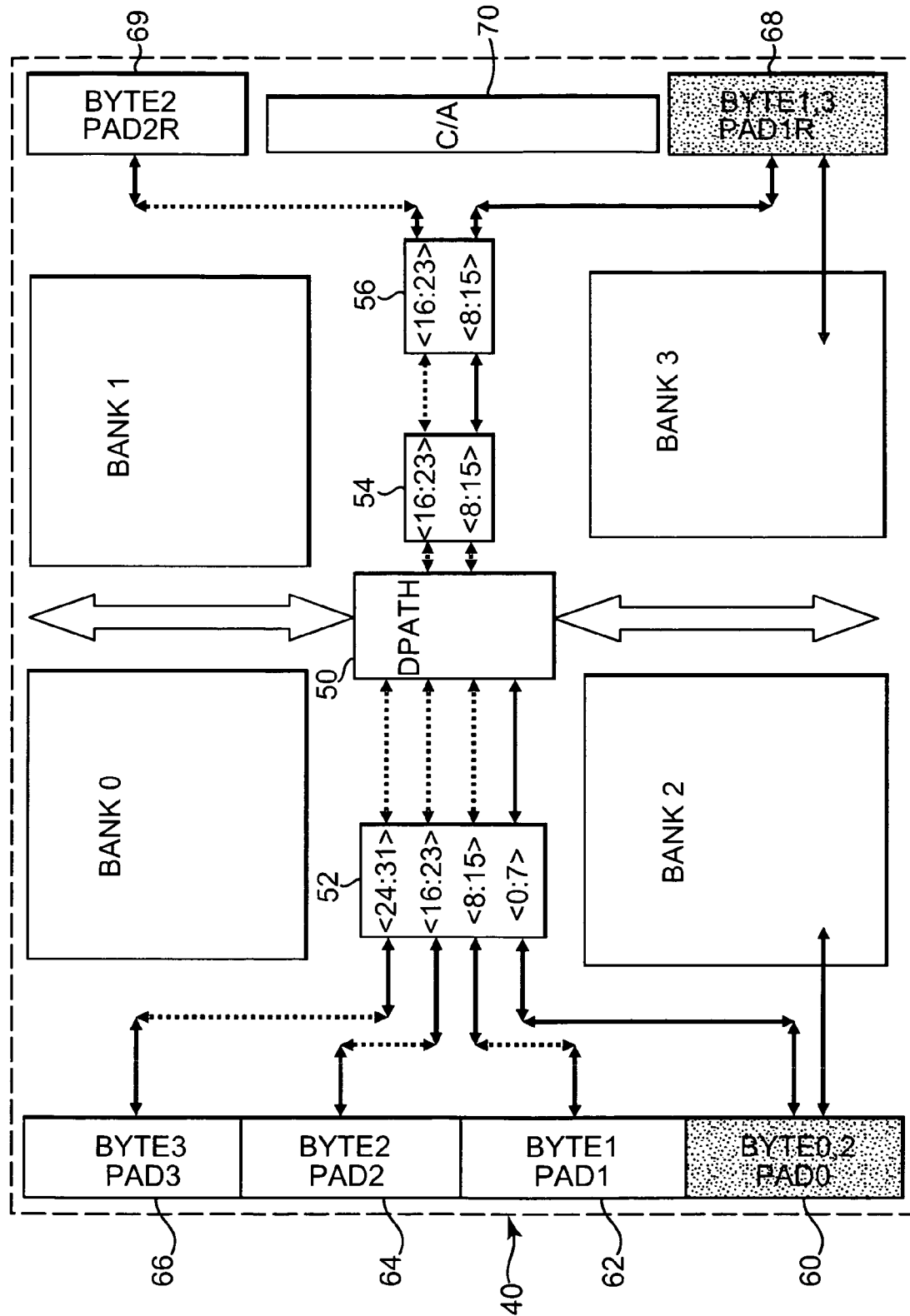
FIG. 6 illustrates a memory device with edge pad architecture configured as a ball grid array in accordance with an alternative embodiment of the present invention.

FIG. 6 illustrates semiconductor memory device 40 configured as a ball grid array (BGA) component using 16-bit processing. Semiconductor memory device 40 is configured as described above, including bank 0, bank 1, bank 2, and bank 3, data path 50, first, second, and third buffer and multiplexing logic blocks 52, 54, and 56, data pads 60, 62, 64, 66, 68, and 69 and command and address pad 70. As with the prior illustrations of semiconductor memory device 40, all data pads 60, 62, 64, 66, 68, and 69 and the command and address pad 70 are located adjacent a first or a second edge of semiconductor memory device 40.

In one embodiment, memory device 40 is configured for a BGA application such that each the data pads that will be used in the application are located on two edges of memory device 40. In one embodiment of a 16-bit BGA application data pads 60 and 68 are used; data pad 60 being on a first edge and data pad 68 being on a second edge of memory device 40. As such, data pads 62, 64, 66 and 69 are not used.

In one embodiment, byte 0 is transmitted via data pad 60 and byte 1 is transmitted via data pad 68. As such, one data byte is transmitted at a first edge of semiconductor memory device 40 and one data byte is transmitted at a second edge of semiconductor memory device 40. First and second edges are on opposite sides of the chip of semiconductor memory device 40. In one case, command and address pad 70 is located adjacent one data pad on one edge of semiconductor memory device 40.

By controlling activation logic within the device, semiconductor memory device 40 is adaptable to a variety of applications and architecture requirements. Providing data pads distributed along both edges of the chip device allows utilization of data pads on only one side, or on both sides depending on the application.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory component configured in a wafer having at least a first and second edge, the memory component comprising:
   at least one memory bank array;
   a data path coupled to the memory bank array; and
   a plurality of data pads coupled to the data path and configured with the data path to bus data to and from the memory bank array and configured such that each of the data pads are located adjacent the first and second edges of the wafer;
   wherein the memory component is configurable for alternative applications such that in a first application all of the data pads used to bus data are located only on the first edge of the wafer and such that in a second application at least one of the data pads used to bus data is located on the first edge of the wafer, the data pad on the first edge being coupled to the memory bank by the data path, and at least one of the data pads used to bus data is located on the second edge of the wafer, the data pad on the second edge being coupled to the memory bank by the data path.

2. The memory component of claim 1, wherein the first and second edges of the wafer are configured on opposite sides of the wafer.

3. The memory component of claim 1, wherein the memory component is further configured as a known good die with all of the data pads used to bus data located only on a first edge of the die.

4. The memory component of claim 1, wherein the memory component is further configured as a ball grid array with at least one of the data pads used to bus data located on a first edge of the ball grid array and at least one of the data pads used to bus data located on a second edge of the ball grid array.

5. The memory component of claim 1 further comprising a plurality of logic circuits configured between the data path and the data pads for bussing the data and for controlling which data pads used to bus data.

* * * * *